US012757520B2

(12) United States Patent
Guo et al.

(10) Patent No.: US 12,757,520 B2
(45) Date of Patent: Oct. 6, 2026

(54) PREPARATION METHOD OF ELECTRODE GRID LINES, AND PHOTOVOLTAIC (PV) CELL

(71) Applicant: BEIJING ZENITHNANO TECHNOLOGY CO., LTD., Beijing (CN)

(72) Inventors: Lingjie Guo, Beijing (CN); Guanghang Yang, Beijing (CN); Kaiqi Pan, Beijing (CN); Zhicong Li, Beijing (CN); Jingjing Shu, Beijing (CN)

(73) Assignee: BEIJING ZENITHNANO TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 19/192,425

(22) Filed: Apr. 29, 2025

(65) Prior Publication Data

US 2026/0096242 A1 Apr. 2, 2026

Related U.S. Application Data

(63) Continuation-in-part of application No. PCT/CN2024/136649, filed on Dec. 4, 2024.

(30) Foreign Application Priority Data

Sep. 29, 2024 (CN) ......................... 202411372836.4

(51) Int. Cl.
*H10F 77/20* (2025.01)

(52) U.S. Cl.
CPC .................................. *H10F 77/215* (2025.01)

(58) Field of Classification Search
CPC ...................................................... H10F 77/215
See application file for complete search history.

(56) References Cited

FOREIGN PATENT DOCUMENTS

| | | | |
|---|---|---|---|
| CN | 101807628 A | * | 8/2010 |
| CN | 113793883 A | | 12/2021 |
| CN | 116314368 A | | 6/2023 |

(Continued)

OTHER PUBLICATIONS

Park et al., KR 20150143070 A, English Machine Translation. (Year: 2015).*

(Continued)

*Primary Examiner* — Tae-Sik Kang
(74) *Attorney, Agent, or Firm* — Bayramoglu Law Offices LLC

(57) ABSTRACT

The provided is a preparation method of electrode grid lines, and a photovoltaic (PV) cell. The preparation method of electrode grid lines includes the following steps: S1: providing a substrate, and forming a polymer layer on the substrate; S2: providing a mold corresponding to a desired electrode pattern, and imprinting a trench corresponding to the electrode pattern on the polymer layer through the mold; S3: coating a conductive material on the polymer layer, such that the conductive material fully fills the trench, and scraping off any excess conductive material; S4: drying the conductive material; S5: upon drying, dissolving the polymer layer; and S6: sintering the conductive material to form the electrode grid lines. The method can achieve the electrode pattern at high printing accuracy, minimizes the waste material, and greatly reduce the usage and cost of the material.

12 Claims, 1 Drawing Sheet

(56) References Cited

FOREIGN PATENT DOCUMENTS

| | | | | | |
|---|---|---|---|---|---|
| CN | 118472104 | A | | 8/2024 | |
| JP | 2010137358 | A | * | 6/2010 | ............. B29C 59/04 |
| KR | 20150143070 | A | * | 12/2015 | ............. H01B 13/00 |

OTHER PUBLICATIONS

Xuchang et al., CN 101807628 A, English Machine Translation. (Year: 2010).*

Moriyama et al., JP 2010137358 A, English Machine Translation. (Year: 2010).*

* cited by examiner

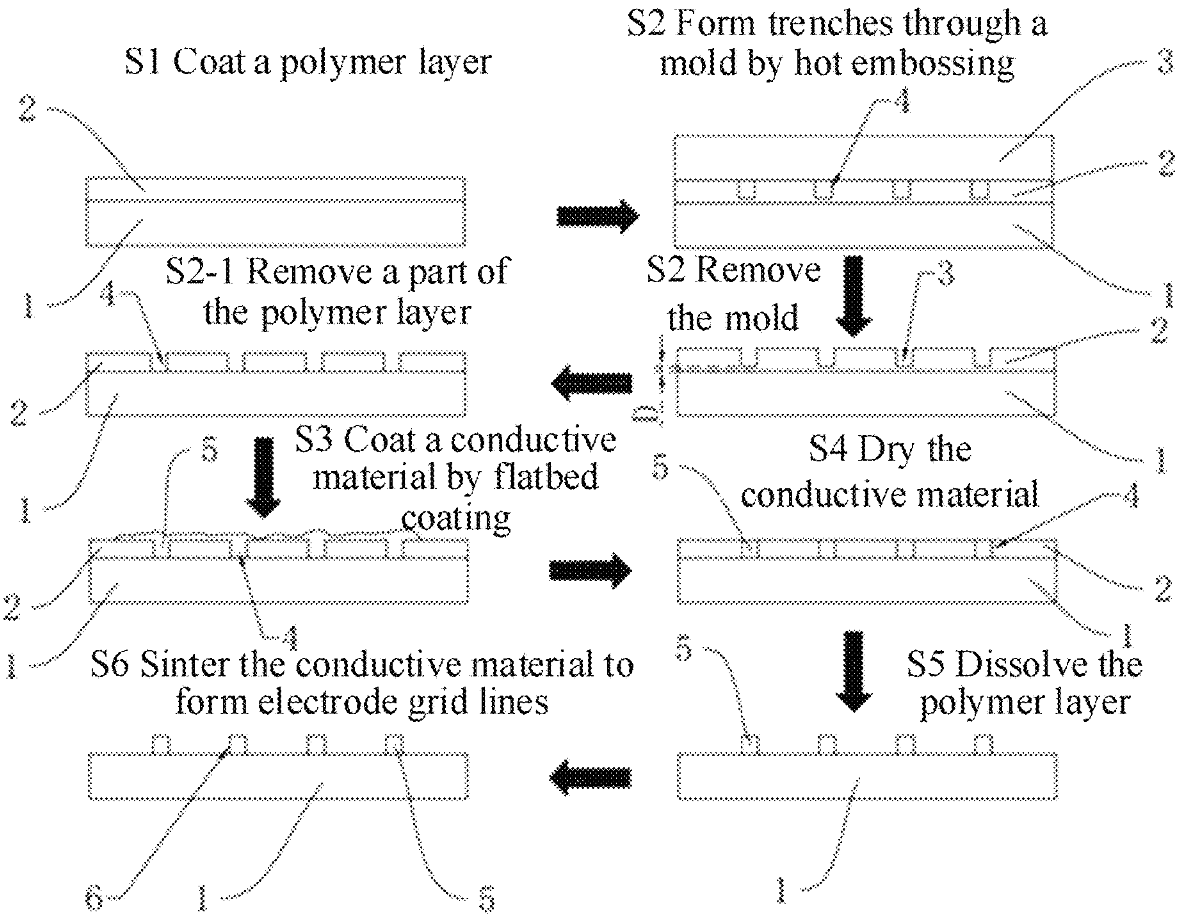
S1 Coat a polymer layer
S2 Form trenches through a mold by hot embossing
S2-1 Remove a part of the polymer layer
S2 Remove the mold
S3 Coat a conductive material by flatbed coating
S4 Dry the conductive material
S6 Sinter the conductive material to form electrode grid lines
S5 Dissolve the polymer layer
1
2
3
4
5
6
D

PREPARATION METHOD OF ELECTRODE GRID LINES, AND PHOTOVOLTAIC (PV) CELL

CROSS-REFERENCE TO THE RELATED APPLICATIONS

This application is a continuation-in-part application of International Application No. PCT/CN2024/136649, filed on Dec. 4, 2024, which is based upon and claims priority to Chinese Patent Application No. 202411372836.4, filed on Sep. 29, 2024, the entire contents of which are incorporated herein by reference.

TECHNICAL FIELD

The present disclosure relates to the field of photovoltaic (PV) technologies, and in particular to a preparation method of electrode grid lines, and a PV cell.

BACKGROUND

Today, coal combustion remains a main form of electricity generation worldwide. However, with the acceleration of industrialization and the continuous depletion of energy, reserves of non-renewable resources such as coal are gradually diminishing, and their exploitation and utilization have caused an increasingly serious negative impact on the environment. Hence, in order to reduce reliance on fossil fuels and promote sustainable development, all countries are actively seeking alternative solutions of renewable resources. Among these alternative solutions, solar energy has received considerable attention as the promising clean energy. The PV silver paste is a key material of the solar cell, and is important to performance of the cell. By optimizing a coating process of the PV silver paste on the solar crystalline silicon wafer, the conductive performance and photoelectric conversion efficiency of the solar cell can be improved significantly.

At present, screen printing is used mainly in industrial production to fabricate electrodes on the PV cell. Screen printing has been widely used in large-scale production, but still faces a series of technical challenges in practical applications. First of all, the insufficient printing accuracy is a major problem. Variable printing parameters and process instabilities often lead to the non-uniform width and thickness of the silver paste, which increases the resistance of the cell and consequently impairs the performance of the cell. Besides, screen printing hardly realizes high-resolution pattern printing below 10 μm to restrict its effect in more precise applications.

Next, the waste material generated in screen printing is also a significant challenge. The waste of silver paste not only increases a production cost but also imposes an environmental burden. The safety problems also cannot be ignored. Solvents and materials used in screen printing are likely to emit hazardous or irritating dust and gas to pose potential threats to the health of the operator and the environment. At last, screen printing has relatively low production efficiency and requires high cleanliness in the production environment, and its relatively slow process speed cannot meet demands of the large-scale production.

Therefore, there is a need to develop an electrode grid line printing technology with high printing accuracy, low production cost, high production efficiency, safety and reliability, to promote sustainable development of the PV cell production.

SUMMARY

In order to develop an electrode grid line printing technology with high printing accuracy, low production cost, high production efficiency, safety and reliability, the present disclosure provides a preparation method of electrode grid lines, and a PV cell.

The preparation method of electrode grid lines, and the PV cell provided by the present disclosure adopt the following technical solutions:

A preparation method of electrode grid lines includes the following steps: S1: providing a substrate, and forming a polymer layer on the substrate; S2: providing a mold corresponding to a desired electrode pattern, and imprinting trenches corresponding to the electrode pattern on the polymer layer through the mold; S3: coating a conductive material on the polymer layer, such that the conductive material fully fills the trench, and scraping off any excess conductive material; S4: drying the conductive material; S5: upon drying, dissolving the polymer layer; and S6: sintering the conductive material to form the electrode grid lines.

According to the above technical solution, with the design of the mold and the trench, the process of scraping off the excess conductive material is controlled accurately, thereby effectively controlling a thickness of the conductive material, and preventing performance degradation caused by a non-uniform thickness. The method can form a dedicate electrode pattern of a few microns on the substrate, and ensures high accuracy and high consistency of the electrode grid line. Moreover, the method minimizes the waste material, greatly reduces the usage and cost of the conductive material, and can lower the production cost and improve the economic benefit for the saved conductive material. With a simple process, and high process accuracy, the method can realize rapid production, which improves production efficiency, meets requirements of industrial production, and can comply with the idea of green and sustainable development, thereby promoting applications of an environment friendly production process.

In a specific implementable solution, in the step S2, an imprinting residual layer has a thickness of 0.5-2 μm.

According to the above technical solution, in the process for imprinting the trenches through the mold, the trench and the substrate are spaced at a distance of 0.5-2 μm. This can effectively prevent direct contact between the mold and the substrate, thereby reducing a rupture risk of the substrate due to a mechanical stress, keeping integrity of the substrate in operation, and improving stability and reliability of the whole system.

In a specific implementable solution, the preparation method of electrode grid lines further includes a step S2-1 between the step S2 and the step S3: removing a part of the polymer layer, such that a bottom of the trench and a top of the substrate are on a same horizontal plane.

According to the above technical solution, by reducing a height of the polymer layer to make the bottom of the trench and the substrate on a same horizontal plane, the conductive material coated in the trench subsequently can directly contact the substrate. This enhances conductive performance and contact quality of the conductive material, and ensures that the conductive material can form a more stable electrode structure, thereby improving the production efficiency and a yield rate.

In a specific implementable solution, in the step S2-1, the polymer layer is etched by reactive-ion etching (RIE), so as to remove the part of the polymer layer.

According to the above technical solution, the RIE can accurately remove a part of the polymer layer to ensure coplanarity between the bottom of the trench and the top of the substrate. The RIE can remove the polymer layer in a short time, can provide a uniform etching effect, and can maintain surface quality of the bottom, thereby ensuring that the conductive material can directly contact the substrate to improve the conductive performance.

In a specific implementable solution, in the step S2, the trenches are obtained by hot-embossing the polymer layer through the mold, and a hot-embossing temperature is 100-180° C.

According to the above technical solution, with this temperature range, the polymer layer can be uniformly pressed on the mold to form a clear and accurate trench structure, thereby improving quality and consistency of the product. Due to a relatively low hot-embossing temperature, thermal injury on the polymer layer can be reduced, degradation or failure of the polymer caused by an overtemperature can be prevented, and performance and stability of the material can be maintained, thereby improving production efficiency and product consistency.

In a specific implementable solution, in the step S4, the drying the conductive material is performed at 100-200° C.

According to the above technical solution, this temperature range can ensure that the conductive material is dried fully to form a stable conductive layer, and enhance an adhesion between the conductive material and the substrate to reduce a risk of liftoff or delamination, thereby improving the electrical performance and the conductive performance.

In a specific implementable solution, a material of the polymer layer is a water-soluble polymer material.

According to the above technical solution, the water-soluble polymer material can be disposed with simple dissolution and coating processes to simplify the production procedure. Meanwhile, the water as a solvent is more environment-friendly, thereby omitting use and waste disposal of organic solvents.

In a specific implementable solution, the water-soluble polymer material is one selected from the group consisting of polyvinyl alcohol (PVA), polyvinylpyrrolidone (PVP), polyethylene glycol (PEG), modified polyvinyl alcohol (mPVA), sodium polyacrylate (PAA-Na), polyvinyl alcohol-polyacrylic acid (PVA-PAA), and polyvinyl alcohol-polyacrylonitrile (PVA-PAN).

In a specific implementable solution, in the step S5, the polymer layer is dissolved with hot water at 60-80° C.

According to the above technical solution, with the high temperature, the dissolution process of the polymer is accelerated, the processing time is shortened, and the production efficiency is improved. Meanwhile, with the hot water, a crystalline texture of the polymer is overcome, such that the polymer is dissolved more uniformly to form a more stable solution.

In a specific implementable solution, in the step S6, the conductive material is sintered at 600-800° C.

According to the above technical solution, with the high-temperature sintering, particles in the conductive layer are connected firmly to improve an interlayer binding force, thereby reducing the liftoff problem, and enhancing the mechanical strength and stability of the whole structure. Meanwhile, at the high temperature, the particles in the conductive material can be fused effectively. This significantly improves the electrical conductivity, and optimizes the conductive performance.

In a specific implementable solution, a material of the substrate is one selected from the group consisting of a monocrystalline silicon thin film, a polycrystalline silicon thin film, a gallium arsenide thin film, a cadmium telluride thin film, and an amorphous silicon thin film.

In a specific implementable solution, the conductive material is one selected from the group consisting of silver paste, copper paste, and aluminum paste, or a mixture thereof; the silver paste further includes of pure silver particles, copper or nickel particles coated with silver.

According to the above technical solution, the silver paste can exhibit excellent electrical conductivity, which reduces a resistance of an electronic device, and improves the performance and efficiency. Meanwhile, it can exhibit efficient and stable conductive performance, and can be adapted to different base materials and manufacturing processes, thereby meeting requirements of a high-performance electronic product.

In a specific implementable solution, a longitudinal cross-sectional shape of the trench is one of a rectangle and a trapezoid.

In a specific implementable solution, a base material of the mold is one selected from the group consisting of a monocrystalline silicon base material, a polycrystalline silicon base material, a glass base material, a quartz base material, a polymer base material, a copper base material, a nickel base material, a copper-nickel alloy base material, a nickel-iron alloy base material, an iron-aluminum alloy base material, and an aluminum alloy base material.

A PV cell includes the electrode grid lines prepared with the above preparation method.

According to the above technical solution, the electrode grid lines in the above preparation method contribute to high accuracy, high conductive performance, desirable surface smoothness, optimized thermal management, enhanced mechanical strength and enhanced durability of the PV cell, and comprehensively improve the performance, efficiency and long-term stability of the PV cell. With the mold for imprinting the accurate trenches on the polymer layer, the high accuracy of the pattern of the electrode grid line is ensured. The accurate patterning is conducive to optimize the photoelectric conversion efficiency and current collecting capability of the PV cell. The conductive material is filled fully, dried and sintered, such that the electrode grid line has excellent electrical electricity. The electrode grid line with high electrical electricity can effectively collect a current generated by the cell, and reduce the resistance and the energy loss, thereby improving overall power output of the cell. The preparation method supports design of different electrode patterns, such that the structure of the electrode grid line can be optimized according to a specific demand of the cell. The flexible design can improve the photoelectric conversion efficiency, and can be adapted to different application scenarios.

In a specific implementable solution, a longitudinal cross-sectional shape of the electrode grid line is a rectangle or a trapezoid; the rectangle has a height of 10±2 μm, and an aspect ratio of 2:1; and the trapezoid has a base angle of 30-70°, a height of 10±2 μm, and an aspect ratio of 2:1.

In conclusion, the present disclosure has the following beneficial effects: With the design of the mold and the trench, the process of scraping off the excess conductive material is controlled accurately, thereby effectively controlling a thickness of the conductive material, and preventing performance degradation caused by a non-uniform thickness. The method can form a dedicate electrode pattern of a few microns on the substrate, and ensures high accuracy and high consistency of the electrode grid line. Moreover, the method minimizes the generation of the waste material, greatly reduces the usage and cost of the conductive material, and can lower the production cost and improve the economic benefit for the saved conductive material.

With a simple process, and high process accuracy, the method can realize rapid production, improves production efficiency, meets requirements of industrial production, and can comply with the idea of green and sustainable development, thereby promoting applications of an environment friendly production process. The electrode grid lines in the above preparation method contribute to high accuracy, high conductive performance, desirable surface smoothness, optimized thermal management, enhanced mechanical strength and enhanced durability of the PV cell, and comprehensively improve the performance, efficiency and long-term stability of the PV cell.

BRIEF DESCRIPTION OF THE DRAWINGS

The FIGURE is a schematic process flowchart of a preparation method of electrode grid lines according to an embodiment of the present disclosure.

Reference numerals: 1: substrate, 2: polymer layer, 3: mold, 4: trench, 5: conductive material, and 6: electrode grid line.

DETAILED DESCRIPTION OF THE EMBODIMENTS

The present disclosure will be further described in detail below with reference to the figure.

Referring to the figure, an embodiment of the present disclosure provides a preparation method of electrode grid lines, including the following steps:

S1: Substrate 1 is provided, and polymer layer 2 is formed on the substrate 1 by coating a polymer solution. Prior to coating, a surface of the substrate 1 should be clean, flat and pollution-free, so as to guarantee quality of the subsequent coating process. Surface treatment is performed on the substrate 1 to enhance an adhesion for the polymer layer 2.

In the embodiment, this step includes, but is not limited to, that a layer of the polymer solution is coated on the substrate 1 by a flatbed coating method, and dried to obtain the polymer layer 2. The flatbed coating includes spin coating, blade coating or spray coating, specifically depending on a property and a desired thickness of the used polymer. The coating rate and uniformity are controlled necessarily in the coating process to ensure a consistent thickness of the polymer layer 2.

Specifically, prior to the coating, necessary pretreatment is performed on the substrate 1. The pretreatment method includes cleaning, drying and surface activation, so as to remove the pollutant on the surface of the substrate 1, increase the surface roughness, and improve the adhesion for the polymer layer 2.

The uniform polymer solution is coated on the substrate 1. The uniformity and the thickness in the coating are controlled. Upon the coating, this step includes, but is not limited to, drying or solidification on the polymer layer 2 at 90-110° C., so as to ensure that physical and chemical properties of the polymer layer meet requirements. In the embodiment, according to the properties and application requirements of the polymer, further solidification may be performed, including but not limited to heating in an oven, such that the polymer layer 2 is further cross-linked and hardened.

A material of the substrate 1 includes, but is not limited to, one selected from the group consisting of a monocrystalline silicon thin film, a polycrystalline silicon thin film, a gallium arsenide thin film, a cadmium telluride thin film, and an amorphous silicon thin film. In the embodiment, preferably, the material of the substrate 1 is the polycrystalline silicon thin film. The silicon wafer is applied to manufacturing of various electronic devices for desirable electrical conductivity and stability as well as desirable thermostability and thermal conductivity.

In the embodiment, a material of the polymer layer 2 is a water-soluble polymer material. The water-soluble polymer material is one selected from the group consisting of PVA, PVP, PEG, mPVA, PAA-Na, PVA-PAA, and PVA-PAN. In the embodiment, preferably, the material of the polymer layer 2 is the PVA. The PVA is insoluble in organic solvents such as acetone, methanol, and gasoline. The PVA can be disposed with simple dissolution and coating processes to simplify the production procedure. Meanwhile, the water as a solvent is more environment-friendly, thereby omitting use and waste disposal of organic solvents.

S2: Mold 3 corresponding to a desired electrode pattern is provided. In the embodiment, the mold 3 matching with the desired electrode pattern is prepared. A base material of the mold 3 includes, but is not limited to, one selected from the group consisting of a monocrystalline silicon base material, a polycrystalline silicon base material, a glass base material, a quartz base material, a polymer base material, a copper base material, a nickel base material, a copper-nickel alloy base material, a nickel-iron alloy base material, an iron-aluminum alloy base material, and an aluminum alloy base material. Meanwhile, the desired electrode pattern is accurately engraved or machined on a surface of the mold. The pattern shows a shape and a layout of the electrode, including trenches 4, a protrusion, and other structural details.

Specifically, the mold 3 is aligned at the substrate 1 coated with the polymer layer 2, so as to ensure that the pattern of the mold 3 is accurately docked with a position on the polymer layer 2. The trenches 4 corresponding to the electrode pattern are imprinted on the polymer layer 2 through the mold 3. The mold 3 is pressed on the polymer layer 2 by hot embossing. A hot-embossing temperature includes, but is not limited to, 100-180° C. Preferably, an optimal hot-embossing condition is as follows: The hot-embossing temperature is 130-160° C., a hot-embossing pressure is 10 MPa, and hot-embossing time is 2 min. Under this condition, the trenches 4 can be hot-embossed desirably. Within this temperature range and this pressure range, the polymer layer 2 becomes soft enough, such that the pattern of the mold 3 can be accurately imprinted on the polymer layer 2, the polymer layer 2 can uniformly form the desired trench 4 structure in the hot-embossing process, and overheating is prevented to cause degradation or flowing of the polymer layer 2.

With this temperature range and this pressure range, the polymer layer 2 can be uniformly pressed on the mold 3 to form a clear and accurate trench 4 structure, thereby improving quality and consistency of the product. Compared with a relatively low hot-embossing temperature, thermal injury on the polymer layer 2 can be reduced, degradation or failure of the polymer caused by an overtemperature can be prevented, and performance and stability of the material can be maintained, thereby improving production efficiency and product consistency.

Upon the hot embossing, an imprinted residual layer has a thickness of 0.5-2 μm. That is, a bottom of the trench 4 and the substrate 1 should be spaced at a certain distance D. The distance D is 0.5-2 μm. This distance can effectively prevent direct contact between the mold 3 and the substrate 1, thereby reducing a rupture risk of the substrate 1 due to a mechanical stress, keeping integrity of the substrate 1 in operation, and improving stability and reliability of the whole system.

Upon these steps, the mold 3 is removed. According to an actual need, the polymer layer 2 may be subjected to follow-up processing such as hardening or cleaning, so as to ensure the clarity and stability of the trench 4 to form the electrode pattern meeting the design requirements.

A longitudinal cross-sectional shape of the trench 4 includes, but is not limited to, one of a rectangle and a trapezoid. In the embodiment, the longitudinal cross-sectional shape of the trench 4 is the rectangle. The rectangle has an aspect ratio of 2:1. The trench 4 is designed as a geometrical shape with a rectangular cross-section, which simplifies the process, and ensures uniform filling of the conductive material 5. In addition, the rectangular trench 4 has a sharp edge, which can better ensure contact and conductive performance of the electrode, and reduce a gap or an insufficient material in the filling process.

S2-1: Upon the hot embossing, the polymer layer 2 is further processed, and a part of the polymer layer 2 is removed, such that the bottom of the trench 4 and a top of the substrate 1 are on a same horizontal plane. This step includes, but is not limited to, that a height of the polymer layer 2 is reduced by RIE. The part removed from the polymer layer 2 is a structure of 0.5-2 μm from the bottom of the trench 4 to the substrate 1.

Specifically, an appropriate RIE etching device is selected, with etching parameters set according to the used polymer material. The etching system should be cleaned, and the desired gas such as oxygen or fluorinated gas should be prepared. Preferably, the oxygen is selected as the gas. According to a thickness and a desired etching depth of the polymer layer 2, an etching power, a gas flow, etching time, and gas pressure are set, so as to ensure uniformity and accuracy of the etching. The substrate 1 is put into an RIE etching cavity, and an etching process is started. In the etching process, reactive ions etch the polymer surface chemically and physically to remove the part of the polymer layer 2, until the bottom of the trench 4 is flush with the top of the substrate 1. Upon the etching, the substrate 1 is cleaned to remove residual etching byproducts and impurities. In the embodiment, deionized water or other appropriate cleaning solvents may be used to ensure the clean surface, and the uniformity and alignment of the trench 4 are inspected.

The RIE can accurately remove the part of the polymer layer 2, and reduce the height of the polymer layer 2, such that the remaining polymer layer 2 in the trench 4 on the substrate 1 is etched to expose a surface of the substrate 1. The RIE can remove the polymer layer 2 within a short time, while providing a uniform etching effect, and keeping surface quality of the bottom of the trench. Upon the etching, the conductive material 5 coated in the trench 4 subsequently can directly contact the substrate 1. This enhances conductive performance and contact quality of the conductive material 5, and ensures that the conductive material 5 can form a more stable electrode structure, thereby improving the production efficiency and a yield rate.

S3: The conductive material 5 is coated on the polymer layer 2. In the embodiment, this step includes, but is not limited to, that the conductive material 5 is coated on the polymer layer 2 by a flatbed coating method, such that the conductive material 5 fully fills the trench 4. Any excess conductive material 5 is scraped off.

Specifically, an appropriate flatbed coating tool, such as a coating blade or a doctor blade, is selected. The conductive material 5 is uniformly coated on the surface of the polymer layer 2. The material should penetrate into and fully fill all grooves 4. In the coating process, special attentions should be paid to the filling of the trench 4 region, and the conductive material 5 should completely cover the bottom and the sidewall of the trench 4. The excess conductive material 5 on the surface is scraped with the flatbed coating tool (such as the doctor blade), until the conductive material 5 in the trench 4 is flush with the surface of the polymer layer 2. The doctor blade should keep parallel with the surface, so as to obtain a uniform coating thickness and prevent damage to the polymer layer 2. Upon the coating, a filling effect is inspected to ensure that the conductive material 5 in the trench 4 is uniform with leakage. When necessary, finishing is performed to remove an unnecessary material or repair an uneven region.

The conductive material 5 is one selected from the group consisting of silver paste, copper paste, and aluminum paste, or a mixture thereof; the silver paste further includes of pure silver particles, copper or nickel particles coated with silver. In the embodiment, preferably, the conductive material 5 is the silver paste. The silver paste can exhibit excellent electrical conductivity, which reduces the resistance of the electronic device, and improves the performance and efficiency. Meanwhile, it can exhibit efficient and stable conductive performance, and can be adapted to different base materials and manufacturing processes, thereby meeting requirements of a high-performance electronic product.

In the embodiment, the PVA of the polymer layer 2 does not react with the organic solvent in the silver paste of the conductive material 5, such that the polymer layer 2 is not adhered with the conductive material 5, and the silver paste of the conductive material 5 can keep the intrinsic shape. This reduces the phenomenon that the conductive performance of the conductive material is affected for imprinting of different shapes of the conductive material 5.

S4: The conductive material 5 is dried. The conductive material 5 is dried by an oven. The drying the conductive material 5 is performed at 100-200° C. This temperature range can ensure that the conductive material 5 is dried fully to form a stable conductive layer, and enhance an adhesion between the conductive material 5 and the substrate 1 to reduce a risk of lift-off or delamination, thereby improving the electrical performance and the conductive performance.

Specifically, according to a type of the conductive material 5 and suggestions of the manufacturer, a temperature of the oven is set at 100-200° C. This temperature range is generally applicable to drying most conductive materials 5, and ensures that the material is dried fully without overheating or damage. A sample coated with the conductive material 5 is carefully put into the oven. A timer of the oven is set to ensure that the sample is dried for enough time at the preset temperature. The drying time is determined according to a specific requirement of the conductive material 5 and a thickness of the layer, and is generally 0.5-10 min. Suggestions provided by the material manufacturer for the drying time should be followed to achieve an optimal drying effect.

In the drying process, the temperature in the oven and the state of the sample are monitored continuously, so as to ensure that the temperature in the oven is stable, and prevent the temperature from being excessively high or excessively low to affect the drying effect of the conductive material 5. In case of temperature fluctuations or other abnormal conditions, immediate adjustments or corrections are made.

When the drying time is over, the sample is taken out from the oven, and the drying effect of the conductive material 5 is inspected. The material should be dried uniformly, without bubbles, delamination, or other defects. The drying quality may be evaluated by visual inspection or an appropriate test method.

S5: Upon drying, the polymer layer 2 is dissolved, which includes, but is not limited to, that the polymer layer 2 is dissolved with hot water at 60-80° C. In the embodiment, the polymer layer 2 is dissolved with the hot water at 70° C. The hot water at a relatively high temperature accelerates the dissolution process of the polymer, thus shortening the processing time, and improving the production efficiency. Meanwhile, with the hot water, a crystalline texture of the polymer is overcome, such that the polymer is dissolved more uniformly to form a more stable solution.

Specifically, upon the drying, the dried sample is carefully put into the hot water at 70° C. The polymer layer 2 should be immersed completely. After soaked for a certain time in the hot water at 70° C., the polymer layer 2 is dissolved gradually. The sample is inspected regularly to observe a dissolution condition of the polymer layer 2.

After the polymer layer 2 is dissolved completely, the sample is taken out from the hot water. The sample may be rinsed with clear water to remove any residual polymer dissolved solution. The sample is then put into a dry environment. The sample should be dried completely, so as to prevent residual moisture from affecting subsequent processing. The sample with the polymer layer 2 removed is inspected. The integrity and surface quality of the conductive material 5 should be confirmed to avoid damage or material loss, so as to ensure that subsequent application and integration can be performed smoothly.

S6: The conductive material 5 is further sintered to form the continuous, intact and nondeformable electrode grid lines 6. The conductive material 5 is sintered at 600-800° C. Specifically, this step includes, but is not limited to, selection of an appropriate sintering furnace. The sintering furnace is set at a temperature of 600-800° C. This temperature range can be applicable to sintering the conductive material 5, and ensure that the conductive material reaches desired conductive performance and a desired structural strength. The processed sample is carefully put into the sintering furnace. The sintering furnace is started, and gradually heated to a preset temperature. In the heating process, a stable temperature is kept to uniformly sinter the conductive material 5. The heating time is generally determined according to the thickness and specific requirements of the material. When the sintering process is over, the temperature in the furnace is gradually cooled to a room temperature. Shock cooling is not allowed to prevent crack or deformation of the material for a thermal stress. Upon cooling, the formed electrode grid lines 6 are inspected to ensure that the electrode grid lines are structurally intact with the conductive performance meeting requirements, and whether there is uneven sintering or a material defect.

With the high-temperature sintering, particles in the conductive layer are connected firmly to improve an interlayer binding force, thereby reducing the lift-off problem, and enhancing the mechanical strength and stability of the whole structure. Meanwhile, at the high temperature, the particles in the conductive material 5 can be fused effectively. This significantly improves the electrical conductivity, and optimizes the conductive performance.

The present disclosure further provides a PV cell, including the electrode grid lines 6 prepared with the above preparation method.

A longitudinal cross-sectional shape of the electrode grid line 6 includes, but is not limited to, a rectangle or a trapezoid. The rectangle has a height of 10±2 μm, and an aspect ratio of 2:1. The trapezoid has a base angle of 30-70°, a height of 10±2 μm, and an aspect ratio of 2:1. An optimal shape of the electrode grid line 6 should be considered comprehensively according to a type, a size, a material and the like of the PV cell. While providing a large contact area, reducing a resistance, achieving more uniform current distribution, reducing the hot-spot problem, and improving the overall efficiency, this can better control a propagation direction of the light, reduces a reflection loss, increases light absorption, and lengthens a path of light in the cell, thereby improving light absorption efficiency.

The electrode grid lines 6 prepared with the above method contribute to high accuracy, high conductive performance, desirable surface smoothness, optimized thermal management, enhanced mechanical strength and enhanced durability of the PV cell, and comprehensively improve the performance, efficiency and long-term stability of the PV cell. With the mold 3 for imprinting the accurate trenches 4 on the polymer layer 2, the high accuracy of the pattern of the electrode grid line 6 is ensured. The accurate patterning is conducive to optimize the photoelectric conversion efficiency and current collecting capability of the PV cell. The conductive material 5 is filled fully, dried and sintered, such that the electrode grid line 6 has excellent electrical electricity. The electrode grid line 6 with high electrical electricity can effectively collect a current generated by the cell, and reduce the resistance and the energy loss, thereby improving overall power output of the cell. The preparation method supports design of different electrode patterns, such that the structure of the electrode grid line 6 can be optimized according to a specific demand of the PV cell. The flexible design can improve the photoelectric conversion efficiency, and can be adapted to different application scenarios.

The implementation principle in the embodiment of the present disclosure is as follows: With the design of the mold 3 and the trench 4, the process of scraping off the excess conductive material 5 is controlled accurately, thereby effectively controlling a thickness of the conductive material 5, and preventing performance degradation caused by a non-uniform thickness. The method can form a dedicate electrode pattern of a few microns on the substrate 1, and ensures high accuracy and high consistency of the electrode grid line 6. Moreover, the method minimizes the waste material, greatly reduces the usage and cost of the conductive material 5, and can lower the production cost and improve the economic benefit for the saved conductive material 5. With a simple process, and high process accuracy, the method can realize rapid production, improves production efficiency, meets requirements of industrial production, and can comply with the idea of green and sustainable development, thereby promoting applications of an environment friendly production process.

The above are preferred embodiments of the present disclosure, but the protection scope of the present disclosure is not limited thereto. Therefore, all equivalent changes made in accordance with the structure, shape, and principle of the present disclosure shall fall within the protection scope of the present disclosure.

What is claimed is:

1. A preparation method of electrode grid lines, comprising the following steps: S1: providing a substrate, and forming a polymer layer on the substrate; S2: providing a mold corresponding to a desired electrode pattern, and imprinting a trench corresponding to the desired electrode pattern on the polymer layer through the mold; S3: coating a conductive material on the polymer layer, wherein the conductive material fully fills the trench, and scraping off any excess conductive material; S4: drying the conductive material; S5: upon drying, dissolving the polymer layer; and S6: sintering the conductive material to form the electrode grid lines, wherein in the step S2, an imprinting residual layer has a thickness of 0.5-2 μm, and wherein the preparation method further comprises a step S2-1 between the step S2 and the step S3: removing a part of the polymer layer, wherein a bottom of the trench and a top of the substrate are on a same horizontal plane.

2. The preparation method of the electrode grid lines according to claim 1, wherein in the step S2-1, the polymer layer is etched by reactive-ion etching (RIE) to remove the part of the polymer layer.

3. The preparation method of the electrode grid lines according to claim 1, wherein in the step S2, the trench is hot-embossed on the polymer layer through the mold, and a hot-embossing temperature is 100-180° C.

4. The preparation method of the electrode grid lines according to claim 1, wherein in the step S4, the step of drying the conductive material is performed at 100-200° C.

5. The preparation method of the electrode grid lines according to claim 1, wherein a material of the polymer layer is a water-soluble polymer material.

6. The preparation method of the electrode grid lines according to claim 5, wherein the water-soluble polymer material is one selected from the group consisting of polyvinyl alcohol (PVA), polyvinylpyrrolidone (PVP), polyethylene glycol (PEG), modified polyvinyl alcohol (mPVA), sodium polyacrylate (PAA-Na), polyvinyl alcohol-polyacrylic acid (PVA-PAA), and polyvinyl alcohol-polyacrylonitrile (PVA-PAN).

7. The preparation method of the electrode grid lines according to claim 1, wherein in the step S5, the polymer layer is dissolved with hot water at 60-80° C.

8. The preparation method of the electrode grid lines according to claim 1, wherein in the step S6, the conductive material is sintered at 600-800° C.

9. The preparation method of the electrode grid lines according to claim 1, wherein a material of the substrate is one selected from the group consisting of a monocrystalline silicon thin film, a polycrystalline silicon thin film, a gallium arsenide thin film, a cadmium telluride thin film, and an amorphous silicon thin film.

10. The preparation method of the electrode grid lines according to claim 1, wherein the conductive material is one selected from the group consisting of silver paste, copper paste, and aluminum paste, or a mixture of the silver paste, the copper paste, and the aluminum paste; the silver paste further comprises of pure silver particles, copper or nickel particles coated with silver.

11. The preparation method of the electrode grid lines according to claim 1, wherein a longitudinal cross-sectional shape of the trench is one of a rectangle and a trapezoid.

12. The preparation method of the electrode grid lines according to claim 1, wherein a base material of the mold is one selected from the group consisting of a monocrystalline silicon base material, a polycrystalline silicon base material, a glass base material, a quartz base material, a polymer base material, a copper base material, a nickel base material, a copper-nickel alloy base material, a nickel-iron alloy base material, an iron-aluminum alloy base material, and an aluminum alloy base material.

* * * * *